United States Patent [19]

Kanazawa

[11] Patent Number: 5,459,353
[45] Date of Patent: Oct. 17, 1995

[54] SEMICONDUCTOR DEVICE INCLUDING INTERLAYER DIELECTRIC FILM LAYERS AND CONDUCTIVE FILM LAYERS

[75] Inventor: Masato Kanazawa, Kyoto, Japan

[73] Assignee: Matsushita Electronics Corporation, Osaka, Japan

[21] Appl. No.: 369,253

[22] Filed: Jan. 5, 1995

Related U.S. Application Data

[63] Continuation of Ser. No. 116,947, Sep. 7, 1993, abandoned, which is a continuation of Ser. No. 834,620, Feb. 12, 1992, abandoned.

[30] Foreign Application Priority Data

Feb. 12, 1991 [JP] Japan ................... 3-018642

[51] Int. Cl.$^6$ ................... H01L 29/43
[52] U.S. Cl. ................... 257/751; 257/759; 257/760; 257/763; 257/764; 257/765; 257/915
[58] Field of Search ................... 357/65, 67, 71; 257/751, 767, 763, 764, 915, 765, 758, 759, 760

[56] References Cited

U.S. PATENT DOCUMENTS

| | | | |
|---|---|---|---|
| 4,107,726 | 8/1978 | Schilling | 357/71 |
| 4,357,203 | 11/1982 | Zelez | 156/643 |
| 4,910,580 | 3/1990 | Küecher et al. | 357/71 |
| 4,924,295 | 5/1990 | Küecher | 357/71 |
| 4,942,451 | 7/1990 | Tamaki et al. | 357/67 |
| 5,040,049 | 8/1991 | Raaijmakers | 357/71 |
| 5,117,273 | 5/1992 | Stark et al. | 437/180 |
| 5,136,362 | 8/1992 | Grief et al. | 357/71 |

FOREIGN PATENT DOCUMENTS

| | | | |
|---|---|---|---|
| 0388563 | 3/1989 | European Pat. Off. . | |
| 0430403 | 8/1990 | European Pat. Off. . | |
| 0005560 | 1/1985 | Japan | 357/71 |
| 0271631 | 11/1990 | Japan | 257/915 |

OTHER PUBLICATIONS

Patent Abstracts of Japan, Kokai #01–241149 to Michio, Sep. 1989, Abstract vol. 013574, Group E–863.
Patent Abstracts of Japan, Kokai #02–235372 to Tatsuro, Sep. 1990, Abstract vol. 014550, Group E–1009.
Patent Abstracts of Japan, Kokai #01–266746 to Hiroyuki, Oct. 1989, Abstract vol. 014032, Group E–876.
N. Kumar et al., "Thin Solid Films", Oct. 1988, pp. 417–428, Failure Mechanisms of TiN Thin Film Diffusion Barriers.
A. S. Bhansali et al, "Journal of Applied Physics", Aug. 1990, pp. 1043–1049, A Thermodynamic Approach for interpreting metallization layer stability and thin–film reactions involving four elements: Application to integrated circuit metallurgy.

(List continued on next page.)

Primary Examiner—William Mintel
Assistant Examiner—Peter Toby Brown
Attorney, Agent, or Firm—Ratner & Prestia

[57] ABSTRACT

A first interlayer dielectric film layer is formed on a P-type semiconductor substrate. The first interlayer dielectric film is made of a BPSG film formed by the method of atmospheric pressure chemical vapor deposition. First connection holes are formed at specified positions of the first interlayer dielectric film layer. A first conductive film layer is formed in a region including at least the first connection holes. The first conductive film layer is composed of three layers by sequentially laminating a barrier metal film, an aluminum alloy film, and an anti-reflection film. On the first conductive film layer formed in a specified pattern, a second interlayer dielectric film layer is formed. The second interlayer dielectric film layer is composed of a lower layer of silicon oxide film, an intermediate layer of silicon oxide film made of inorganic silica or organic silica, and an upper layer of silicon oxide film. Specified positions of the second interlayer dielectric film layer are selectively removed. The removed regions become second connection holes. A second conductive film layer is formed thereon. The second conductive film layer is composed of two layers of refractory metal film in the bottom layer and aluminum alloy film in the top layer.

3 Claims, 7 Drawing Sheets

OTHER PUBLICATIONS

Y. Takata et al., "A Highly Reliable Multilevel Interconnection Process for 0.6 μm CMOS Devices", IEEE VLSI Multilevel Interconnection Conference, Eighth International Proceedings, IEEE Catalog No. 91TH0359-0, pp. 13-19, Jun. 11-12, 1991.

SEMICONDUCTOR DEVICE INCLUDING INTERLAYER DIELECTRIC FILM LAYERS AND CONDUCTIVE FILM LAYERS

This application is a continuation of application Ser. No. 08/116,947 filed Sept. 7, 1993 and now abandoned, which is a continuation of application Ser. No. 07/834,620, filed Feb. 12, 1992 and also abandoned.

BACKGROUND OF THE INVENTION

1. Field of the Invention

The present invention relates to the reliability of connection holes between wirings formed within a semiconductor device, and more particularly to a semiconductor device having a much higher reliability than a conventional connection hole structure and a method of fabricating the same.

2. Description of the Prior Art

Recently, as the degree of integration of semiconductor devices has advanced, wiring layers have tended to be produced with finer dimensions and their number has multiplied.

At the present, leading the progress of finer dimension technology of semiconductor devices, semiconductor memories have been developed by making use of multilayer wiring technology.

Multilayer wiring technology employs a polycide film with two layers of polycrystalline silicon and a refractory metal silicide. It is, however, difficult to obtain multilayer wiring with aluminum alloy film when multiple layers and finer dimension layers are desired. Therefore, a single layer is used for forming a wiring layer with aluminum alloy film.

However, the sheet resistance of a wiring layer using polycide film is about one hundred fold higher than the sheet resistance of a wiring layer of aluminum alloy film. Accordingly, when manufacturing a semiconductor device which operates at high speed, a wiring delay due to polycide film occurs. Thus, in comparison with a semiconductor device comprised of aluminum alloy film, a semiconductor device comprised of polycide film, capable of operating at high speed, is not obtained. It is hence important to realize both fine dimension and multiple layers using aluminum alloy film with a low sheet resistance, thereby maintaining the reliability of the semiconductor device using it.

In addition, along with the progress of finer dimension technology, there is a trend which relates to finer dimension technology in the field of microcomputer devices such as logic, Application Specific Integrated Circuit (ASIC), and gate arrays. In particular, in the field relating to microprocessing units (hereinafter called the MPU), the operating speed and function of the MPU are upgraded progressively. Therefore, the development of finer dimension technology for microcomputer devices is expected to be developed. CPU performance varies with the size of the data to be handled. For example, in the same 32-bit MPUs, the performance is determined by the constraints imposed as a result of the provided function and its operating frequency, that is, the maximum processing speed.

At present, the operating frequency for a 32-bit MPU is about 50 MHz. The degree of integration of a 32-bit MPU is realized by forming 1,000,000 transistors in an area of 15 mm × 15 mm or less. Moreover, in order to raise the operating frequency and in order to realize high functionality with an MPU, an enhancement in the degree of integration is indispensable. Accordingly, a more sophisticated finer technology is needed.

In the field of MPUs, in order to operate at high speed as well as to realize high function, attempts have been made to avoid the lowering of operating speed due to wiring delay. For this purpose, hitherto, multilayer wiring using aluminum alloy film has been employed. To improve the performance of the MPU, therefore, it is important to increase the dimensional fineness achievable with multilayer wiring technology using aluminum alloy film.

Several problems which result from increased dimensional fineness of wiring using aluminum alloy film are deterioration and breakdown of wiring by migration. Such reliability problems relating to semiconductor devices are major factors which impede the progress of improved dimensional fineness technology.

Migration is classified into two areas: electromigration and stress migration. Much has been reported relating to the deterioration phenomenon which results in wiring as a result of stress migration. For example, stress migration is described in the 25th Annual Proceedings Reliability Physics 1987, pp. 15–21, "The Effect of Cu Addition to Al—Si interconnects on Stress Induced Open-Circuit Failure." Stress migration occurs when wiring, comprised of aluminum alloy film, is subjected to the stress of an interlayer dielectric film surrounding the wiring and the passivation film and the temperature history in the particular circumstances. As a result of the stress and temperature history, the aluminum atoms in the aluminum alloy film are moved. In the resulting positions of the moved aluminum atoms, cavities (called voids) are formed in the wiring. As the voids grow, the wiring is finally broken down. This phenomenon is called stress migration. In the above article, the addition of copper elements to aluminum alloy film is described. As a result, copper elements precipitate into the interface of the crystal grains of the aluminum film, thereby suppressing movement of aluminum atoms. It has thus been reported that the resistance to stress migration has been improved. This reported case is realized by paying attention to the wiring of the aluminum alloy film.

On the other hand, for finer dimension multilayer wiring technology using aluminum alloy film, as the width of wiring is reduced, it is simultaneously necessary to reduce the size of connection holes for connecting upper and lower wirings. The diameter of the connection holes for connecting upper and lower wirings must be smaller than the minimum width of the upper and lower wirings. For example, if the width of the wiring is 1.0 μm, the diameter of the connection hole must be 1.0 μm or less. If connection holes are used which have a diameter which is greater than the minimum width of the wiring, the width of the wiring is limited by the size of the connection holes. Accordingly, the density of the wiring cannot be raised easily, and the degree of integration cannot be enhanced. Hence, the chip size is larger if semiconductor devices having the same functions are used.

The prior art is described below with reference to the drawings. FIG. 8 is a process sectional view showing a prior art method of manufacturing a semiconductor device in the prior art. A first conductive type semiconductor substrate is exemplified by P-type semiconductor substrate 1. In the P-type semiconductor substrate 1, it is assumed in the following explanation that the semiconductor elements of an ordinary MOS transistor, a MOS capacitor, a bipolar transistor and resistance is formed (not shown).

On the P-type semiconductor substrate 1, a silicon oxide film forms a first interlayer dielectric film layer 2. The silicon oxide film is for example, $SiO_2$ film, BPSG (Boron- Phospho-Silicate Glass) film, or PSG (Phospho-Silicate Glass) film formed using low pressure chemical vapor deposition or atmospheric pressure chemical vapor deposition techniques.

Next, a specified position of the first interlayer dielectric film layer 2 is selectively removed. A first connection hole 4 is formed in the removed region. The P-type semiconductor substrate 1 is exposed on the bottom of the first connection hole 4. The native oxide film formed on the exposed semiconductor substrate 1 is removed. Afterwards, a first conductive film layer 3 is formed in the specified region including the first connection hole 4 (FIG. 8A). This first conductive film layer 3 is formed in a desired pattern by anisotropic etching such as Reactive Ion Etching (hereinafter called RIE). Later, heat treatment is effected at a temperature of about 450° C. (FIG. 8B).

In succession, a second interlayer dielectric film layer 6 is formed on the first conductive film layer 3.

Next, a specified position of a second interlayer insulation film layer 6 is removed selectively. The removed region becomes a second connection hole 5. A native oxide film is formed on the first conductive film layer 3 exposed on the bottom of the second connection hole 5. By removing this native oxide film, the surface of the first conductive film layer 3 is exposed. A second conductive film layer 7 is formed in a specified region at least including the second connection hole 5 (FIG. 8C). The second conductive film layer 7 is formed of an aluminum alloy film.

The second conductive film layer 7 is formed in a desired pattern by an anisotropic etching method such as RIE (FIG. 8D).

By this fabricating method, a two-layer wiring structure is realized.

Afterwards, a passivation film on the semiconductor element is formed with a film thickness of 500 to 1200 nm.

In a semiconductor device fabricated by the conventional method, degradation phenomenon due to high temperature storage at 180° C. occurs as explained below. A semiconductor device is fabricated for measuring the degree of deterioration. The conditions with which the semiconductor device is fabricated is explained below. As a first interlayer dielectric film layer 2, a BPSG film is deposited on the P-type semiconductor substrate in a film thickness of 60 nm. A first conductive film layer 3 is deposited on the BPSG film. A second interlayer dielectric film layer 6 is formed thereon. A second connection hole 5 is formed in the second interlayer dielectric film layer 6. As a second conductive film layer 7, an aluminum alloy film is deposited with a film thickness of 1000 nm. As a passivation film, a PSG film having a thickness of 300 nm and a silicon nitride film having a thickness of 800 nm are formed.

FIG. 9 shows the relation between the contact hole size and the open failure rate of a second connection hole.

As the high temperature storage time is increased to 180° C., the open failure rate increases. After standing for 1600 hours, if the diameter of second connection hole 5 is smaller than about 1.4 µm, the open failure rate increases suddenly. That is, in the prior art, although the conductive state is established immediately after manufacture, failure in the semiconductor device occurs by standing at a temperature of 180° C. When the diameter of the connection hole is smaller than a specific size, open failure results, which poses a serious problem for reliability.

Thus, in the composition of the prior art, in a semiconductor device with multilayer wiring, when the diameter of the second connection hole 5 becomes small, serious reliability problems result.

When multilayer wiring comprised of a fine dimensional structure is manufactured in a semiconductor device of the prior art, in addition to wiring breakage due to stress migration, open failure of connection holes occurs, and a serious reliability problem takes place for connection holes having a diameter of about 1.4 µm or less.

Failed semiconductor devices have been analyzed by use of a focused ion beam (FIB) technique. As a result it was found that voids were formed in the aluminum alloy film which is the second conductive film layer 7, at the interface between the first conductive film layer 3 in the second connection hole 5 and the aluminum alloy film as the second conductive film layer 7. When voids are thus formed, the aluminum alloy film which is the second conductive film layer 7 is eliminated. In this way, it was determined that disconnection was the cause of the open failure.

The same problem occurs when copper elements are preliminarily added to the aluminum alloy film.

The correlation between open failure rate and passivation film stress have also been investigated in order to search the cause of open failure. The stress of the passivation film was varied by the type of the passivation film. As a result of measurement of the semiconductor device having a passivation film comprised of two layers of PSG film of 300 rim in thickness and silicon nitride film of 800 nm in thickness, a semiconductor device having the passivation film comprised of a single layer of PSG film of 300 rim in thickness, a semiconductor device having a passivation film composed of a single layer of silicon nitride of 800 nm in thickness, and a semiconductor device without a passivation film, the PSG film formed by atmospheric pressure chemical vapor deposition method had a tensile stress of $2 \times 10^{-9}$ dynes/cm$^2$, and the silicon nitride film formed by plasma enhanced chemical vapor deposition method had a compressive stress of $9 \times 10^{-9}$ dynes/cm$^2$.

FIG. 10 shows the cumulative open failure of each semiconductor device after high temperature storage at 180° C. in nitrogen atmosphere and after standing for 1000 hours.

In a semiconductor device without passivation film, the cumulative open failure was not increased, while a semiconductor device which is formed with a silicon nitride film with a strong compressive stress demonstrated an obvious increase in cumulative open failure.

In the prior art, the second conductive film layer 7 was formed by sputtering. Accordingly, in the second connection hole 5, the coverage of the second conductive film layer 7 is poor. Hence, the thickness of the second conductive film layer 7 in the second connection hole 5 is very thin. Accordingly, due to the stress of the passivation film in the upper part, the aluminum atoms are moved, and voids are formed in the second connection hole 5, thereby easily leading to open failure.

As a method of improving the coverage of the second conductive film layer 7, the technique of burying the second connection hole 5 in a conductive film layer is known. For example, by burying tungsten, the coverage of the second conductive film layer 7 in the second connection hole 5 may be notably improved. In the case of tungsten burying, however, the resistance value of tungsten is increased by about ten-fold as compared with the case using the conventional aluminum alloy film. Due to such resistance increase, wiring delays occur, which may lead to operating error of the semiconductor device. It is hence necessary to plan the design again by taking the resistance increase into consideration. Yet, the conventional design asset cannot be used directly.

The above problem, that is, occurrence of voids in the second connection hole 5, may be easily avoided by forming the second conductive film layer 7 of a refractory metal such as tungsten. Since the melting point is high in tungsten and other refractory metal, the wire is not easily broken by the stress of the passivation film. However, tungsten and other refractory metals are higher in resistivity as compared with aluminum alloy film, and have increased wiring resistance.

It is hence an object of the invention to present a constitution in which the second conductive film layer is not moved easily by the stress of the upper passivation film. It is another object of the invention to prevent the occurrence of voids in the second connection hole. It is a further object of the invention to suppress the increase of wiring resistance to a minimum. It is a further object of the invention to present a semiconductor device particularly free from reliability problems if the diameter of the connection hole in the multilayer wiring using aluminum alloy film is smaller than about 1.4 µm. A manufacturing method is also disclosed.

SUMMARY OF THE INVENTION

In a semiconductor device, by using a barrier metal film in the first conductive film layer, monocrystalline silicon precipitating in the contact area of the aluminum alloy film and P-type semiconductor substrate is effectively prevented. Accordingly, the contact failure in the contact area due to precipitation of monocrystalline silicon may be prevented. At the same time, aluminum spikes are not induced in the first connection hole due to mutual diffusion of the aluminum alloy film and the silicon of P-type semiconductor substrate.

In addition, since a titanium film is used in the lower layer of the first conductive film layer, the nitrogen leaving the titanium nitride film of the intermediate layer is prevented from entering the aluminum alloy film. Hence, shortening of life due to electromigration of the aluminum alloy film may be prevented.

Moreover, since the titanium film of the upper layer and aluminum alloy film are alloyed, movement of aluminum atoms in the aluminum alloy film may be suppressed. By alloying both of them, in addition, grain growth in the aluminum alloy film may be suppressed. That is, occurrence of voids formed in the aluminum alloy film may be prevented. In addition, the resistance to stress migration may be enhanced.

There is an anti-reflection film in the upper layer of the first conductive film layer, so that a photoresist pattern transferred as a mask pattern may be formed in a specified region.

Of the second interlayer dielectric film layer, the silicon oxide film of the lower layer prevents the first conductive film layer from oxidizing by moisture of silicon oxide film as the intermediate layer.

Reversely, the silicon oxide film of the upper layer of the second interlayer dielectric film layer prevents moisture absorption of the silicon oxide film of the intermediate layer.

Of the second interlayer dielectric film layer, the silicon oxide film of the intermediate layer flattens the step difference of the first conductive film layer, so that the second conductive film layer may not be broken.

The semiconductor device of the invention is heat-treated and the refractory metal film of the second conductive film layer and the aluminum alloy film layer are alloyed, so that movement of aluminum atoms may be suppressed. In addition, since the refractory metal gets into the aluminum alloy film by alloying, grain growth of aluminum alloy film inside may be suppressed. That is, formation of voids in the aluminum alloy film may be prevented. As a result, the resistance of aluminum alloy film to stress migration may be improved.

In the semiconductor device of the invention, moreover, by forming a refractory metal in the lower layer of the second conductive film layer, movement of atoms composing the second conductive film layer of the upper layer by stress of the passivation film may be prevented, and occurrence of voids in the second connection hole may be suppressed. The increase of wiring resistance may be kept to a minimum, and when applied in the design model of the prior art, operating error in the semiconductor device is not induced, and the design asset of the prior art may be directly utilized.

Further, in the semiconductor device of the invention, when the diameter of the second connection hole is greater than about 0.7 µm, the open failure rate does not increase by high temperature storage at 180° C.

If the coverage of the aluminum alloy film in the second connection hole is poor, the open failure rate can be prevented.

The open failure rate may also be reduced by controlling the thickness of the titanium film and diameter of the second connection hole.

Increase of the open failure rate may also be prevented in case of a silicon nitride film having a high stress directly on the second conductive film layer as the passivation film.

In addition, titanium film is a metal with very high reactivity, and alloying is also promoted on the first conductive film layer formed in the bottom of the second connection hole. Accordingly, when connecting the first conductive film layer and the second conductive film layer through the second connection hole, contact failures are notably decreased. Thus, the refractory metal film prevents formation of voids in the aluminum alloy film, and by using titanium film as the refractory metal film, contact failure in the second connection hole may be decreased.

The titanium film is a highly reactive material, and the same effects are obtained by the alloy film of titanium and other refractory metal (for example, the alloy film of titanium and tungsten).

According to the semiconductor device fabricating method of the present invention, since the second connection hole is formed by a combination of isotropic etching and anisotropic etching, the wiring is not cut on a step in the connection hole.

After removing the native oxide film formed on the first conductive film layer by argon back sputtering, the second conductive film layer is formed without being exposed to the atmosphere, so that the contact of the two is tight, and contact failure is avoided.

In addition, in the method of fabricating semiconductor devices of the present invention, since the refractory metal film is heat-treated to alloy also the first conductive film layer, the contact between the first conductive film layer and the second conductive film layer becomes tighter. As a result, lowering of yield due to contact failure is prevented. At the same time, damage caused by etching may be recovered by heat treatment.

DESCRIPTION OF THE PREFERRED EMBODIMENT

Figure 1:
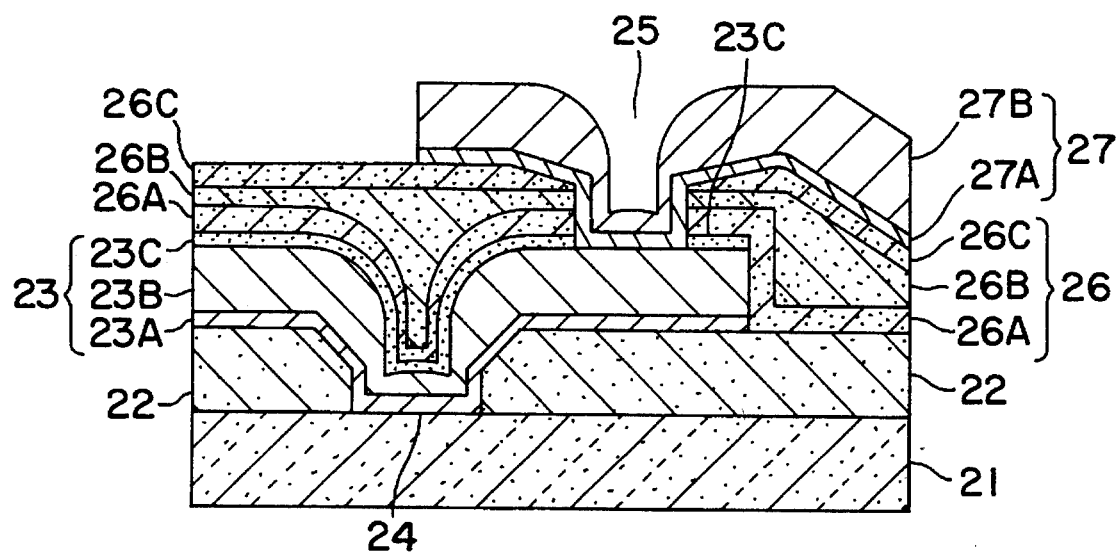
FIG. 1 is a sectional view showing a semiconductor device of the present invention.

Referring now to the drawings, an embodiment of the present invention is described in detail below. FIG. 1 is a sectional view for explaining a first embodiment of the semiconductor device of the present invention.

A semiconductor substrate with a first conductive type, for example, a P-type semiconductor substrate 21 is used. However, using an N-type semiconductor substrate, the following description is quite the same. In the following explanation, it is assumed that any one of the ordinary semiconductor elements of MOS transistors, MOS capacitors, bipolar transistors and resistors has been already formed on the P-type semiconductor substrate 21 (not shown).

A first interlayer dielectric film layer 22 is formed on the P-type semiconductor substrate 21. The first interlayer dielectric film layer 22 is made of a BPSG film formed by a method of atmospheric pressure chemical vapor deposition.

Instead of the BPSG film, however, other dielectric films may be used, such as $SiO_2$ film and PSG film. The first interlayer dielectric film layer 22 is disposed in order to maintain the dielectric strength between the semiconductor element formed in the P-type semiconductor substrate 21 and the first conductive film layer 23. The thickness of the first interlayer dielectric film layer 22 is about 400 to 1000 nm. The first interlayer dielectric film layer 22 is disposed in order to improve the step coverage of the first conductive film layer 23 formed thereon.

A first connection hole 24 is formed at a specified position of the first interlayer dielectric film layer 22. The first connection hole 24 is formed in a shape so as not to break the upper first conductive film layer 23. That is, the shape of the first connection hole 24 is tapered so that the upper opening size of the first interlayer dielectric film layer 22 may be larger while the lower opening size may be smaller.

The first conductive film layer 23 is formed in a region at least containing the first connection hole 24. The first conductive film layer 23 is composed of three layers of a barrier metal film 23A, an aluminum alloy film 23B and an anti-reflection film 23C. The first conductive film layer 23 may also be composed of a single layer of aluminum alloy film alone, or two layers of barrier metal film and aluminum alloy film, or two layers of aluminum alloy film and anti-reflection film.

The first conductive film layer 23 is appropriately alloyed with the P-type semiconductor substrate 21. Accordingly, the contact characteristics are stabilized.

The thickness of the aluminum alloy film 23B is about 300 to 700 nm. The aluminum alloy 23B is doped at least with an element for preventing migration (e.g. Cu, Ti, Pd).

The aluminum alloy film 23B of this embodiment is doped with about 1.0% by mass of Si for preventing aluminum spikes and about 0.5% by mass of Cu for preventing migration.

The barrier metal film 23A is formed beneath the aluminum alloy film 23B. At this time, the barrier metal film 23A brings about the following action. When the aluminum alloy film 23B and the P-type semiconductor substrate 21 contact with each other, monocrystalline silicon precipitates. Such monocrystalline silicon increases the contact resistance value in the connection area between the aluminum alloy film 23B and the P-type semiconductor substrate 21. By forming the barrier metal film 23A, an increase of the contact resistance value due to precipitation of monocrystalline silicon is avoided in the first connection hole 24. It also prevents formation of aluminum spikes in the area of the first connection hole 24 due to mutual diffusion of the aluminum alloy film 23B and silicon atoms of P-type semiconductor substrate 21. The barrier metal film 23A is composed of a titanium film deposited by sputtering and a titanium nitride film deposited by reactive sputtering. The thickness of the titanium film is about 10 to 40 nm, and the thickness of the titanium nitride film is about 40 to 150 nm.

The titanium film and the titanium nitride film of the barrier metal film 23A are formed by an inline method of sputtering. By inline sputtering, the contact resistance value may be remarkably decreased by the contact between the titanium film and the titanium nitride film, since the titanium nitride film is deposited on the titanium film without forming native oxide on the titanium film.

The total thickness of the titanium film and the titanium nitride film is about 50 to 190 nm. As the total thickness value is about 10% of the first interlayer dielectric film layer 22 in thickness, the step coverage of the aluminum alloy film 23B on the first connection hole 24 is improved notably.

The barrier metal film 23A produces the same effects if composed of refractory metal, refractory silicide, refractory metal alloy or their laminate structure.

In addition, different effects are brought about when the barrier metal film 23A is composed of three layers of titanium film deposited by sputtering, titanium nitride film deposited by reactive sputtering, and titanium film deposited by sputtering. At this time, the thickness of the lower titanium film is about 10 to 40 nm, the thickness of the intermediate titanium nitride film is about 40 to 150 nm, and the thickness of the upper titanium film is about 20 to 60 nm. By the upper titanium film, invasion of nitrogen leaving the intermediate titanium nitride film into the aluminum alloy film 23B is prevented. When invasion of nitrogen into aluminum alloy film 23B is prevented, shortening of life of the aluminum alloy film 23B due to electromigration may be avoided.

It is necessary to form the upper titanium film with a thickness of 20 to 60 nm for prevention of nitrogen invasion into the aluminum alloy film 23B and electromigration of the aluminum alloy film 23B.

Furthermore, the upper titanium film and aluminum alloy film 23B are alloyed. This is effective to suppress the movement of aluminum atoms of the aluminum alloy film 23B. Furthermore, by alloying, titanium gets into the aluminum alloy film 23B. Hence, grain growth in the aluminum alloy film 23B may be suppressed. That is, occurrence of voids in the aluminum alloy film 23B is prevented. In addition, the resistance to stress migration may be enhanced.

It is necessary to form the upper titanium film with a thickness of 20 to 60 nm for increasing the resistance of stress migration.

Similar effects are obtained when the barrier metal film 23A is formed of an alloy film of titanium and tungsten deposited by sputtering. The thickness of the alloy film of titanium and tungsten is about 40 to 150 nm. When the barrier metal film 23A is formed of the alloy film of titanium and tungsten, titanium and aluminum alloy film 23B are alloyed. As a result, titanium gets into the aluminum alloy film 23B. Consequently, movement of aluminum atoms of the aluminum alloy film 23B is suppressed. It is also possible to suppress grain growth in the aluminum alloy film 23B. That is, occurrence of voids in the aluminum alloy film 23B may be prevented. Thus, the resistance to stress migration may be enhanced.

The anti-reflection film 23C is formed on the aluminum alloy film 23B. The anti-reflection film 23C reduces the surface reflectivity of the first conductive film layer 23. Usually, when processing the first conductive film layer 23 into a desired shape by RIE, a pattern of photoresist is formed in the specified region. The photoresist pattern is formed by a reduced projection exposure method. By the light from the reduced projection exposure apparatus, the photoresist pattern is projected on the photoresist and sensitized. At this time, if there is a material of high surface reflectivity such as the aluminum alloy film 23B, and having a step difference beneath the aluminum alloy film 23B, the photoresist is sensitized as follows. The photoresist is sensitized not only by the light from the reduced projection exposure apparatus but also by the light reflected by the aluminum alloy film 23B in the matrix after penetrating through the photoresist. Accordingly, the desired pattern on the photomask cannot be projected precisely on the photoresist. Therefore, the anti-reflection film 23C is formed on the entire surface of the aluminum alloy film 23B. By reducing the surface reflectivity, sensitization of the photoresist by the light reflected from the matrix may be decreased. As a result, the desired pattern formed on the photomask may be precisely transferred on the photoresist. Using the anti-reflection film 23C, the pattern of the photoresist formed may be also transferred at high precision when opening the second connection hole 25 by anisotropic etching (such as RIE).

The anti-reflection film 23C is formed of a titanium nitride film deposited by reactive sputtering. The thickness of the titanium nitride film is about 20 to 60 nm. The same effects will be obtained if the anti-reflection film 23C is composed of refractory metal film or refractory metal silicide film or an alloy film of refractory metal.

As mentioned above, all of the barrier metal film 23A, the aluminum alloy film 23B, and anti-reflection film 23C are formed using the same sputtering method. Since each of these films are reactive for the chemical characteristics, oxide films on the surface of these films are formed by contact air. The contact resistance is increased by the oxide films. So it is desirable that the films of the barrier metal film 23A, the aluminum alloy film 23B, and the anti-reflection film 23C are formed using inline sputtering.

A second interlayer dielectric film layer 26 is formed on the first conductive film layer 23 formed in a desired shape. The second interlayer dielectric film layer 26 is composed of a lower layer of silicon oxide film 26A, an intermediate layer of silicon oxide film 26B using inorganic silica or organic silica, and an upper layer of silicon oxide film 26C. The lower layer of silicon oxide film 26A is formed by applying a high frequency in a vapor phase containing, for example, $SiH_4$ or TEOS (tetraethylorthosilicate). It is deposited by the so-called plasma enhanced chemical vapor deposition method.

The intermediate layer of silicon oxide film 26B is an inorganic silica or organic silica in gel form. The silica is applied on the silicon oxide film 26A by spinning, and baked. The silicon oxide film 26C is formed, as is the silicon oxide film 26A, by a method of plasma enhanced chemical vapor deposition. In this way, the second interlayer dielectric film layer 26 is composed of three layers, the silicon oxide films 26A, 26B, 26C.

Of the second interlayer dielectric film layer 26, the lower silicon oxide film 26A contacts with the first conductive film layer 23 and the silica of the silicon oxide film 26B. The lower silicon oxide film 26A prevents oxidation of the first conductive film layer 23 by the moisture contained in the silica when forming the silicon oxide film 26B. The intermediate silicon oxide film 26B flattens the step difference of the first conductive film layer 23. That is, the surface of the upper silicon oxide film 26C is flattened. This helps to prevent breakdown of the second conductive film layer 27 formed on the silicon oxide film 26C in later processing due to its step difference. The upper silicon oxide film 26C adds to the film strength of the second interlayer dielectric film layer 26 itself. The top silicon oxide film 26C also protects the surface of the intermediate silicon oxide film 26B. The top silicon oxide film 26C further prevents the silicon oxide film 26B from absorbing moisture.

The thickness of the silicon oxide film 26A is about 100 to 400 nm.

For preventing moisture contained in the intermediate silicon oxide film 26B arriving at the surface of the first conductive film layer 23, it is important that the thickness of the lower silicon oxide film 26A is about 100 to 400 nm by the method of plasma enhanced chemical vapor deposition using gas which includes TEOS.

The thickness of the silicon oxide film 26B is about 150 to 250 nm. The thickness of the silicon oxide film 26C is about 200 to 500 nm. It is appropriate that the thickness of the upper silicon oxide film 26C is about 200 to 500 nm for mechanical strength in protecting the lower silicon oxide film 26B. The total film thickness of the second interlayer dielectric film layer 26 is about 500 to 1000 nm.

By using the total film thickness of the second interlayer dielectric film layer 26, insulation between the first conductive film layer 23 and the second conductive film layer 27 is achieved.

A second connection hole 25 is formed at a specified position of the second interlayer dielectric film layer 26. The second connection hole 25 is designed to prevent disconnection of the second conductive film layer 27 formed as the upper layer in a later process. That is, the hole is tapered so that the upper opening size of the second interlayer dielectric film layer 26 may be larger while the lower opening size may be smaller.

A second conductive film layer 27 is formed in a region at least containing the second connection hole 25. The second conductive film layer 27 is composed of two layers of a bottom refractory metal film 27A and a top aluminum alloy film 27B. The second conductive film layer 27 is formed in a greater thickness than the first conductive film layer 23 in order to lessen the step difference of the multilayer wiring.

While the refractory metal film 27A and the aluminum alloy film 27B of the second conductive film layer 27 are active for the chemical characteristics, oxide films on the surface of these films are formed by contact air. The contact resistance is increased by the oxide films. When forming these film, it is important to use inline sputtering.

The refractory metal film 27A and the aluminum alloy film 27B as the second conductive film layer 27 are alloyed. Accordingly, movement of aluminum atoms of the aluminum alloy film 27B may be suppressed. By alloying, the refractory metal gets into the aluminum alloy film 27B. The refractory metal will suppress grain growth of the aluminum alloy film 27B inside. As a result, occurrence of voids in the aluminum alloy film 27B may be prevented. Hence, the resistance of the aluminum alloy film 27B to stress migration may be enhanced. Furthermore, the refractory metal film 27A is also alloyed with the first conductive film layer 23. As a result, the contact of the first conductive film layer 23 and the second conductive film layer 27 is tighter. Consequently, lowering of yield due to contact failure is prevented.

In order that voids may not be occurred in the aluminum alloy film 27B, the refractory metal film 27A of the bottom layer and aluminum alloy film 27B are alloyed. Thus, by alloying, the refractory metal atoms get into the aluminum alloy film. As a result, it is effective to suppress movement of aluminum atoms induced by the stress of the passivation film.

The thickness of the aluminum alloy film 27B is about 700 to 1200 nm. The aluminum alloy film 27B is, as with the aluminum alloy film 23B, doped at least with elements for preventing migration (e.g. Cu, Ti, Pd). The aluminum alloy film 27B used in this embodiment is doped with about 1.0% by mass of Si for preventing aluminum spikes, and about 0.5% by mass of Cu for preventing migration.

The refractory metal film 27A is formed beneath the aluminum alloy film 27B. The refractory metal film 27A is formed in order to prevent occurrence of voids in the aluminum alloy film 27B. The refractory metal film 27A is composed of a titanium film deposited by sputtering. The thickness of the titanium film is about 30 to 150 nm.

Since the second conductive film 27 is composed of two layers of titanium film and aluminum alloy film 27B, the titanium film and aluminum alloy film 27B are alloyed. It helps to suppress movement of aluminum atoms inside of the aluminum alloy film 27B. It is also effective to suppress grain growth of the aluminum alloy film 27B as the titanium gets into the crystal grain boundary of the aluminum alloy film 27B. That is, formation of voids inside the aluminum alloy film 27B is suppressed. In addition, the resistance of the aluminum alloy film 27B to stress migration may be enhanced.

The refractory metal film 27A may also be composed of other refractory metals (W, Mo, Ta, Hf, etc.), refractory metal compound, refractory metal silicide, or alloy of refractory metals. Likewise, formation of voids inside the aluminum alloy film 27B may be prevented. The refractory metal film 27A is appropriately alloyed with the upper aluminum alloy film 27B in subsequent heat treatment. By alloying, grain growth of aluminum alloy film may be suppressed. Thus, by using the material suppressing the grain growth more efficiently, the growth of voids formed in the aluminum alloy film may be suppressed. It is more effective for enhancement of resistance to stress migration.

FIGS. 2A–D are process sectional views for explaining a first embodiment of the present invention relating to a method of fabricating a semiconductor device.

As the semiconductor substrate of the first conductive type, for example, the P-type semiconductor substrate 21 is used in the following description. The following description is also applicable to the use of an N-type semiconductor substrate. It is assumed in the following explanation that any one of the ordinary semiconductor elements including a MOS transistor, a MOS capacitor, a bipolar transistor and a resistor has been already formed on the P-type semiconductor substrate 21 (not shown).

A first interlayer dielectric film 22 is formed on the P-type semiconductor substrate 21. A silicon oxide film formed by low pressure chemical vapor deposition or atmospheric pressure chemical vapor deposition may be used. As the silicon oxide film, for example, a BPSG film formed by atmospheric pressure chemical vapor deposition method is used. Instead of BPSG film, however, the silicon oxide film may also be composed of $SiO_2$ film, PSG film and other dielectric films. The first interlayer dielectric film layer 22 is intended to maintain dielectric strength between the semiconductor element formed on the P-type semiconductor substrate 21, and the first conductive film layer 23. The thickness of the first interlayer dielectric film layer 22 is about 400 to 1000 nm. The first interlayer dielectric film 22 is disposed in order to improve the step coverage of the first conductive film layer 23 formed thereon. That is, by heat treatment and flowing of the first interlayer dielectric film layer 22, the surface of the first conductive film layer 23 is flattened. For flowing, the temperature of heat treatment is as high as 850° to 950° C., which is carried out in nitrogen gas atmosphere, or mixed gas atmosphere of hydrogen and oxygen. By flowing in a mixed gas atmosphere of hydrogen and oxygen, the surface is flattened more smoothly than flowing in a nitrogen gas atmosphere.

Figure 2A:
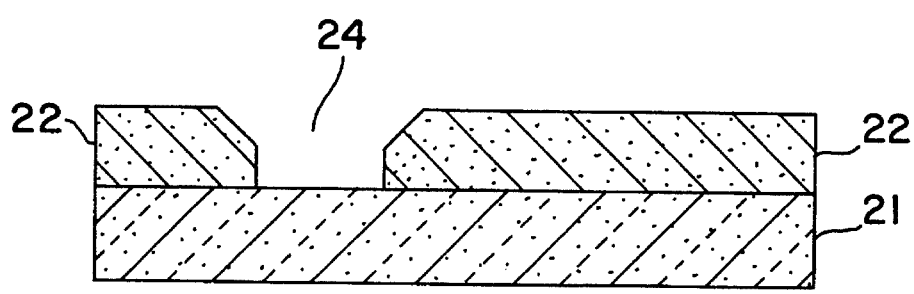
FIGS. 2A–2D are process sectional views showing various steps in a method of fabricating a semiconductor device according to the present invention.

Next, by selectively removing the specified position of the first interlayer dielectric film layer 22, a first connection hole 24 is formed. The first connection hole 24 is formed so as not to break the upper first conductive film layer 23. When etching the upper part of the first interlayer dielectric film layer 22, isotropic etching such as wet etching is employed. After etching of the upper part, when etching the remaining first interlayer dielectric film layer 22 (lower part), anisotropic etching such as reactive ion etching (RIE) is employed. In this way, the first connection hole 24 is formed. The shape of the first connection hole 24 is tapered so that the upper opening size of the first interlayer dielectric film layer 22 may be larger while the lower opening size may be smaller. If such a shape may be realized, the first connection hole 24 may be formed only by anisotropic etching (FIG. 2A).

After etching, a native oxide film is formed on the exposed P-type semiconductor substrate 21.

The native oxide film on the P-type semiconductor substrate 21 exposed to the bottom of the first connection hole 24 is removed, for example, by a diluting solution such as hydrofluoric acid. Later, the first conductive film layer 23 is formed. The first conductive film layer 23 is composed of three layers of a barrier metal film 23A, an aluminum alloy film 23B, and an anti-reflection film 23C. The first conductive film layer 23 may also be composed of a single layer of aluminum alloy film alone, or two layers of barrier metal film and aluminum alloy film, or two layers of aluminum alloy film and anti-reflection film. The first conductive film layer 23 is processed into a desired pattern by anisotropic etching such as RIE.

Figure 2B:
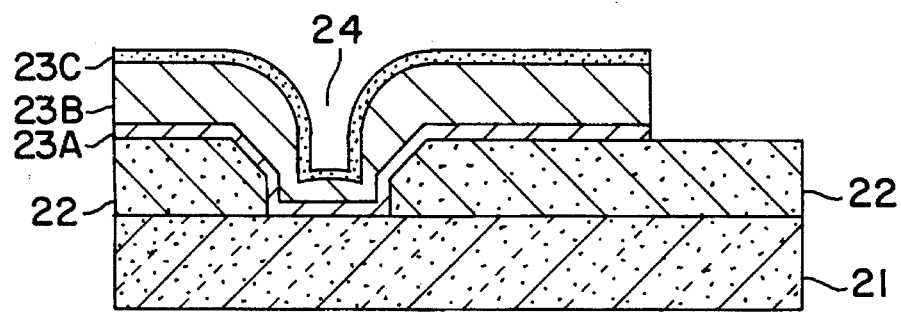

Afterwards, for example, in a hydrogen gas atmosphere, or in a mixed gas atmosphere of hydrogen and nitrogen, heat treatment is conducted at the temperature of about 450° C. By this heat treatment, the first conductive film layer 23 and silicon atoms of the P-type semiconductor substrate 21 are properly alloyed. As a result, the contact characteristics are stabilized. Further, by this heat treatment, the damage caused by anisotropic etching such as RIE is recovered (FIG. 2B).

The aluminum alloy film 23B is formed by sputtering. At this time, the film thickness is about 300 to 700 nm. The aluminum alloy film 23B is doped at least with elements for preventing migration (Cu, Ti, Pd, etc.).

The aluminum alloy film 23B of the embodiment is doped with about 1.0% by mass of Si for preventing aluminum spike, and about 0.5% by mass of Cu for preventing migration.

The barrier metal film 23A is formed beneath the aluminum alloy film 23B.

By forming the barrier metal film 23A, an increase of contact resistance value due to precipitation of single crystalline silicon in the first connection hole 24 is avoided. Formation of aluminum spikes in the first connection hole 24 due to mutual diffusion of the aluminum alloy film 23B and silicon atoms of P-type semiconductor substrate 21 is also prevented. The barrier metal film 23A is composed of two layers of a titanium film deposited by sputtering and a titanium nitride film deposited by reactive sputtering. The film thickness of titanium film is about 10 to 40 nm, and the titanium nitride film is formed with a thickness of about 40 to 150 nm.

The barrier metal film 23A provides the same effects when composed of refractory metal, refractory metal silicide, refractory metal compound, or their stacked structure.

The barrier metal film 23A brings about different effects when composed of three layers of a titanium film deposited by sputtering, a titanium nitride film deposited by reactive sputtering, and a titanium film deposited by sputtering. At this time, the thickness of the lower layer of the titanium film is about 10 to 40 nm, the thickness of the intermediate layer of the titanium nitride film is about 40 to 150 nm, and the thickness of the upper titanium film is about 20 to 60 nm. By the titanium film of the top layer, the nitrogen leaving the intermediate titanium nitride film is prevented from entering the aluminum alloy film 23B. When entry of nitrogen into the aluminum alloy film 23B is prevented, shortening of life of the aluminum alloy film 23B due to electromigration may be prevented.

Furthermore, the titanium film of the upper layer and the aluminum alloy film 23B are alloyed. Accordingly, movement of aluminum atoms in the aluminum alloy film 23B is suppressed. By alloying, moreover, occurrence of voids in the aluminum alloy film 23B may be prevented. In addition, the resistance to stress migration may be enhanced.

Similar effects are produced when the barrier metal film 23A is composed of an alloy film of titanium and tungsten deposited by sputtering. The thickness of the alloy film of titanium and tungsten is about 40 to 150 nm. When the barrier metal film 23A is formed from the alloy film of titanium and tungsten, the titanium and the aluminum alloy film 23B are alloyed. As a result, the titanium atoms get into the aluminum alloy film 23B. Hence, the resistance to stress migration may be enhanced.

The anti-reflection film 23C is formed on the aluminum alloy film 23B. The anti-reflection film 23C decreases the surface reflectivity of the first conductive film 23.

The anti-reflection film 23C is formed of a titanium nitride film deposited by reactive sputtering. The thickness of the titanium nitride film is about 20 to 60 rim. The anti-reflection film 23C produces similar effects if composed of a refractory metal film, refractory metal silicide film, or alloy film of refractory metal.

In succession, a second interlayer dielectric film layer 26 is formed on the first conductive film layer 23 in a specified pattern. The second interlayer dielectric film layer 26 is composed of a lower layer of silicon oxide film 26A, an intermediate layer of silicon oxide film 26B using inorganic silica or organic silica, and a upper layer of silicon oxide film 26C. The lower silicon oxide film 26A is formed by applying high frequency in a vapor phase containing, for example, $SiH_4$ or TEOS (tetraethylorthosilicate). It is deposited by the so-called plasma enhanced chemical vapor deposition method.

The intermediate silicon oxide film 26B is organic silica or inorganic silica in gel form. The silica is applied on the silicon oxide film 26A by spinning, and baked. The silicon oxide film 26C is formed by the plasma enhanced chemical vapor deposition method as with the silicon oxide film 26A.

Of the second interlayer dielectric film layer 26, the lower silicon oxide film 26A contacts with the first conductive layer 23 and the silica of the silicon oxide film 26B. The lower silicon oxide film 26A prevents oxidation of the first conductive film layer 23 by the moisture contained in silica when forming the silicon oxide film 26B. The intermediate silicon oxide film 26B flattens the step difference of the first conductive film layer 23 of the matrix. That is, the surface of the upper silicon oxide film 26C is flattened. Accordingly, in the later process, the second conductive film layer 27 formed on the silicon oxide film 26C is prevented from being broken due to a step difference. The upper silicon oxide film 26C adds to the strength of the second intermediate insulation film layer 26 itself. It further protects the surface of the intermediate silicon oxide film 26B. It moreover prevents moisture absorption of the silicon oxide film 26B.

The thickness of the silicon oxide film 26A is about 100 to 400 rim. The silicon oxide film 26B is formed by repeating the spinning application process of silica and baking process several times at a temperature of about 450° C. The thickness of the silicon oxide film 26B is about 150 to 250 run. The thickness of the silicon oxide film 26C is about 200 to 500 nm. Finally, the total thickness of the second interlayer dielectric film layer 26 is about 500 to 1000 nm.

Any one of the three silicon oxide films 26A, 26B, 26C composing the second interlayer dielectric film layer 26 may be a silicon oxide film formed by the following method. For example, in a vapor phase containing at least TEOS, after thickly depositing the silicon oxide film by the plasma enhanced chemical vapor deposition method by applying a high frequency signal, the entire surface is etched to form a silicon oxide film in a specified thickness. Or, the silicon oxide film may be formed by pyrolysis of mixed gas of ozone and TEOS.

A specified position of the second interlayer dielectric film layer 26 is removed selectively. The removed region becomes a second connection hole 25. The second connection hole 25 is intended to prevent breakdown of the second conductive film layer 27 formed in the upper part in a layer process. That is, the upper region of the second interlayer dielectric film layer 26 is formed by isotropic etching such as wet etching. Later, the lower region is formed by anisotropic etching such as RIE (reactive ion etching). As a result, the hole is formed in a taper so that the upper opening size of the second interlayer dielectric film layer 26 may be large while the lower opening size may be small. If formed in such a shape, the second connection hole 25 may be formed by anisotropic etching only.

Figure 2C:
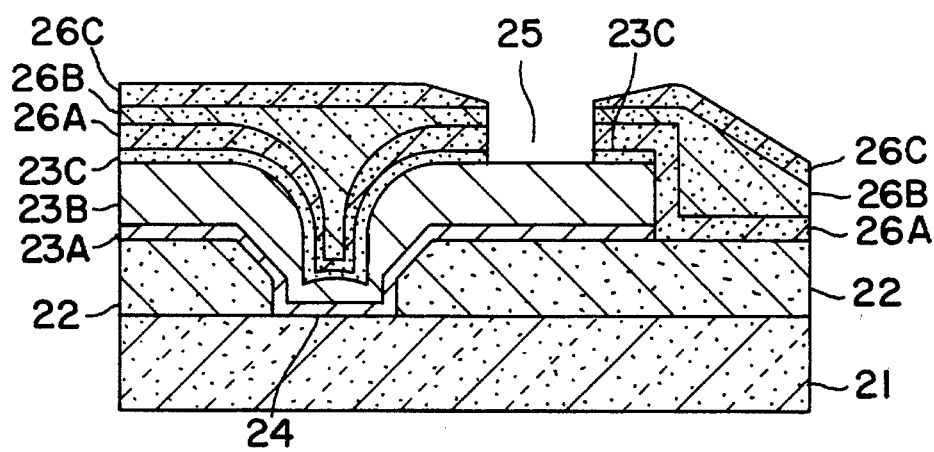

After forming the second connection hole 25, heat treatment is applied at a temperature of about 380° C. By this heat treatment, the damage by etching may be recovered. Furthermore, the silicon oxide film 26B exposed on the side wall of the second connection hole 25 may be baked until solid simultaneously (FIG. 2C).

In forming the second connection hole 25 which includes removal of the anti-reflection film 23C to expose the aluminum alloy film 23B, a native oxide film, especially aluminum oxide ($Al_2O_3$) is formed on the first conductive film 23 layer on the exposed surface. It is removed by sputtering using argon ions. At this time, the pressure of argon gas is about 5 mtorr.

Removal of the native oxide film is intended to tighten the contact between the first conductive film layer 23 exposed to the lower of the second connection hole 25 and the second conductive film layer 27, thereby avoiding contact failure.

The process of removing the native oxide film on the first conductive film layer 23 is not limited to the sputtering method using argon, but any other method may be employed as long as the native oxide film on the first conductive film layer 23 can be removed. For example, RIE using reactive gas may be employed.

The second conductive film layer 27 is formed without exposing the surface of the thus obtained clean first conductive film layer to the air.

The second conductive film layer 27 is composed of two layers, using refractory metal film 27A in the bottom layer, and the aluminum alloy film 27B in the top layer. The second conductive film layer 27 is formed in a greater thickness than the first conductive film layer 23 in order to lessen the step difference of the multilayer wiring.

Afterwards, the second conductive film layer 27 is formed in a specified shape by anisotropic etching such as RIE.

Next, for example, in hydrogen gas atmosphere, or in a mixed gas atmosphere of hydrogen and nitrogen, heat treatment is conducted at a temperature of about 450° C. By heat treatment, the refractory metal film 27A and aluminum alloy film 27B composing the second conductive film layer 27 are alloyed. It is accordingly effective to suppress the movement of aluminum atoms of the aluminum alloy film 27B. By alloying, moreover, the refractory metal atoms get into the aluminum alloy film 27B. In the presence of refractory metal film 27A, grain growth of aluminum alloy film 27B inside may be suppressed. As a result, formation of voids in the aluminum alloy film 27B is prevented. Hence, the resistance of aluminum alloy film 27B to stress migration is enhanced.

Figure 2D:
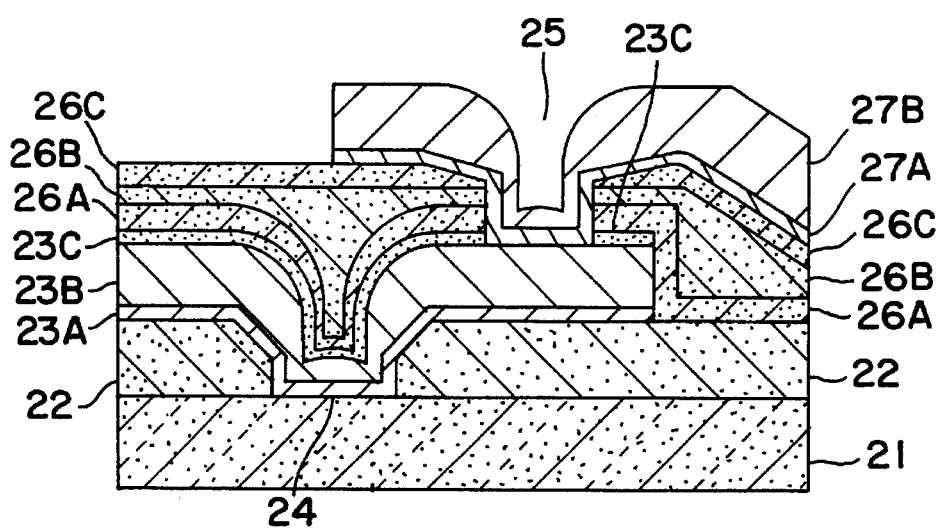

Furthermore, by heat treatment, the refractory metal film 27A also alloys the first conductive film layer 23 exposed to the bottom of the second connection hole 25. Accordingly, lowering of yield due to contact failure may be prevented. Besides, the damage caused by anisotropic etching such as RIE may be recovered by heat treatment (FIG. 2D).

In order to prevent formation of voids in the aluminum alloy film 27B, the refractory metal film 27A of the bottom layer and aluminum are alloyed. By alloying, as mentioned above, the refractory metal atoms get into the aluminum alloy film. It hence suppresses movement of aluminum atoms induced by the stress of the passivation film. For the ease of expression of this effect, alloying of the bottom refractory metal 27A and top aluminum alloy film 27B is made uniform. For this purpose formation of the interface layer that may impede alloying is prevented, in the interface of the aluminum alloy film 27B and refractory metal film 27A. What may become an interface layer in the hitherto process is, for example, the oxide layer of refractory metal film. Therefore, depositing of refractory metal film 27A and depositing of aluminum alloy film 27B are done continuously without being exposed to the atmosphere. By forming them continuously, occurrence of voids inside of the aluminum alloy film 27B may be suppressed.

The aluminum alloy film 27B may be formed by sputtering. Its film thickness is about 700 to 1200 nm. The aluminum alloy film 27B is doped, at least, with elements for preventing migration (Cu, Ti, Pd), as with the aluminum alloy film 23B. The aluminum alloy film 27B used in this embodiment is doped with about 1.0% by mass of Si for preventing aluminum spikes, and about 0.5% by mass of Cu for preventing migration.

The refractory metal film 27A is formed beneath the aluminum alloy film 27B. The aluminum alloy film 27A is formed in order to prevent formation of voids in the aluminum alloy film 27B. The refractory metal film 27A is composed of a titanium film deposited by sputtering. The thickness of the titanium film is about 30 to 100 nm.

When the second conductive film layer 27 is composed of two layers of titanium film and aluminum alloy film 27B, the titanium film and aluminum alloy film 27B are alloyed. Thus, movement of aluminum atoms inside of the aluminum alloy film 27B may be suppressed. In addition, the titanium atoms get into the crystal grain boundary of the aluminum alloy film 27B, thereby suppressing the grain growth of the aluminum alloy film 27B. That is, formation of voids inside the aluminum alloy film 27B may be prevented. In addition, the resistance of the aluminum alloy film 27B to stress migration may be enhanced.

The refractory metal film 27A may be composed also of other refractory metal (W, Mo, Ta, Hg, etc.), refractory metal compound, refractory metal silicide, or an alloy of refractory metals. Similarly, occurrence of voids inside the aluminum alloy film 27B may be prevented. Moreover, the refractory metal film 27A and the aluminum alloy film 27B of the top layer are appropriately alloyed by later heat treatment. By alloying, grain growth of aluminum alloy film is suppressed. Thus, by using a material suppressing the grain growth, the occurrence of voids formed in the aluminum alloy film may be suppressed more effectively. It is thus more effective for the enhancement of resistance of stress migration.

In succession, usually, the passivation film is formed. The passivation film is composed of PSG film and silicon nitride film. Th PSG film relaxes the high stress of the silicon nitride film. The stress of silicon nitride film induces breakdown of the second conductive film layer 27. The PSG film is formed, for example, by the method of atmospheric pressure chemical vapor deposition. The thickness of PSG film is about 100 to 400 nm. The silicon nitride film prevents moisture and pollutants from getting inside. The silicon nitride film is formed, for example, by the method of plasma enhanced chemical vapor deposition. The thickness of silicon nitride film is about 500 to 1200 nm (not shown).

Figure 3:
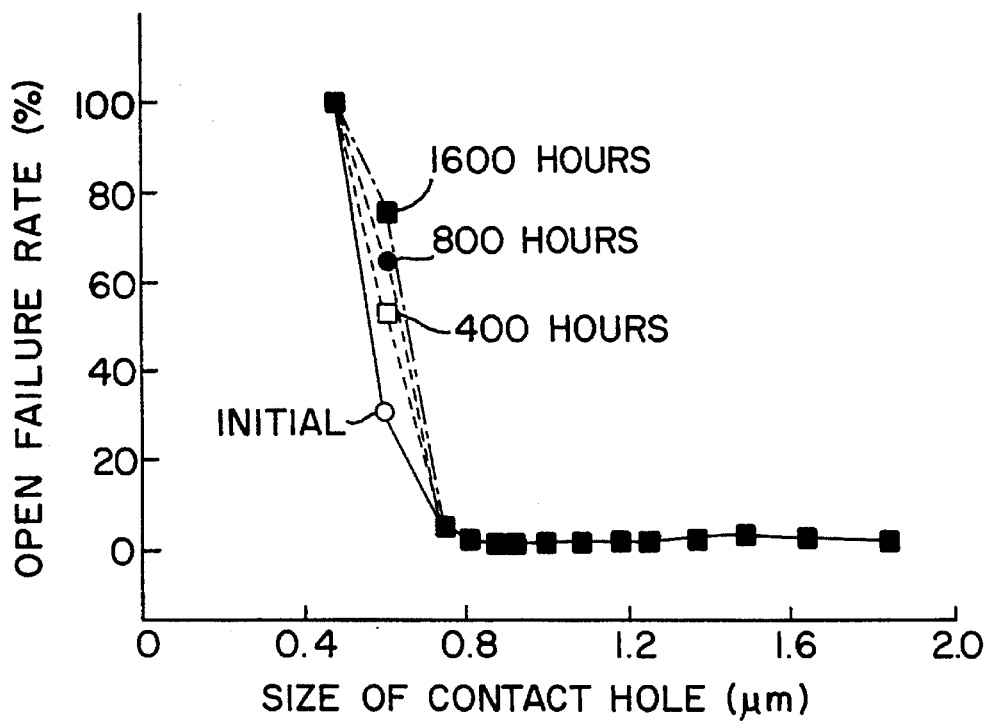
FIG. 3 is a diagram showing the relation between the open failure rate and the size of a connection hole in accordance with the present invention.

FIG. 3 shows the results of reliability tests of the second connection hole of the semiconductor device fabricated according to this embodiment.

The semiconductor device in the test is composed as follows. On a 6-inch P-type semiconductor substrate, a BPSG film of 600 nm in thickness is deposited. On the BPSG film, a barrier metal film and an aluminum alloy film are deposited as a first conductive film layer. The barrier metal film is composed of two layers of titanium film and titanium nitride film. The thickness of titanium film is 20 nm, and the thickness of titanium nitride film is 100 nm. The aluminum alloy film is doped with 1.0% by mass of silicon and 0.5% by mass of copper. The thickness of aluminum alloy film is 600 nm. A second interlayer dielectric film is composed of a silicon oxide film in a film thickness of 400 nm, a silicon oxide film of inorganic silica or organic silica in gel form, and a silicon oxide film in a film thickness of 300 nm. A second conductive film layer is composed of a titanium film in a thickness of 50 nm, and an aluminum alloy film in a thickness of 1000 nm. A passivation film is composed of a PSG film in a thickness of 300 rim and a silicon nitride film in a thickness of 800 nm.

On the thus composed P-type semiconductor substrate, 100,000 second connection holes are disposed in series. A total of 120 contact chains of the first conductive film layer and second conductive film layer are formed.

In composing the sample, what is different from the prior art is that the second conductive film layer is composed of two layers of titanium film and aluminum alloy film.

FIG. 3 shows the results of open failure rate of the contact chains of this semiconductor device by investigating the electrical conducting state. The axis of abscissas denotes the contact hole size or the diameter of the second connection holes. The axis of ordinates represents the open failure rate. The open failure rate right after manufacture is indicated by an arrow with the term "initial" in the diagram. The other curves are obtained at different high temperature storage durations at 180° C in a nitrogen atmosphere. The high temperature storage durations are 400 hours, 800 hours and 1600 hours, and the open failure rate after letting the semiconductor device stand for each duration is shown. As known therefrom, when the diameter of the second connection holes is greater than about 0.6 μm, the open failure rate caused by high temperature storage at 180° C. does not increase, unlike the prior art shown in FIG. 8. That is, by forming the titanium film in the bottom layer of the second conductive film, the open failure rate was lowered as compared with the prior art. At this time, if the titanium film is formed in the bottom layer of the aluminum alloy film, the coverage of aluminum alloy film in the second connection hole is not improved. In the diagram, however, even in the positions where the thickness of the second conductive film layer is very thin, the open failure rate is lower than in the prior art. This fact suggests that voids are not formed in the aluminum alloy film of the top layer of the second conductive film layer in the second connection hole. That is, occurrence of voids is suppressed. Even in the contact hole side falling into open failure due to growth of voids in the prior art, open failures are not witnessed in the embodiment.

In the prior art, when the contact hole size is smaller than 1.4 μm, a problem arises in the reliability of semiconductor devices. In this embodiment, by contrast, as long as the contact hole size is greater than 0.6 μm, no adverse effect is caused to the reliability of the semiconductor device. In this embodiment, lowering of reliability of the semiconductor device by formation of voids may be prevented.

Figure 4:
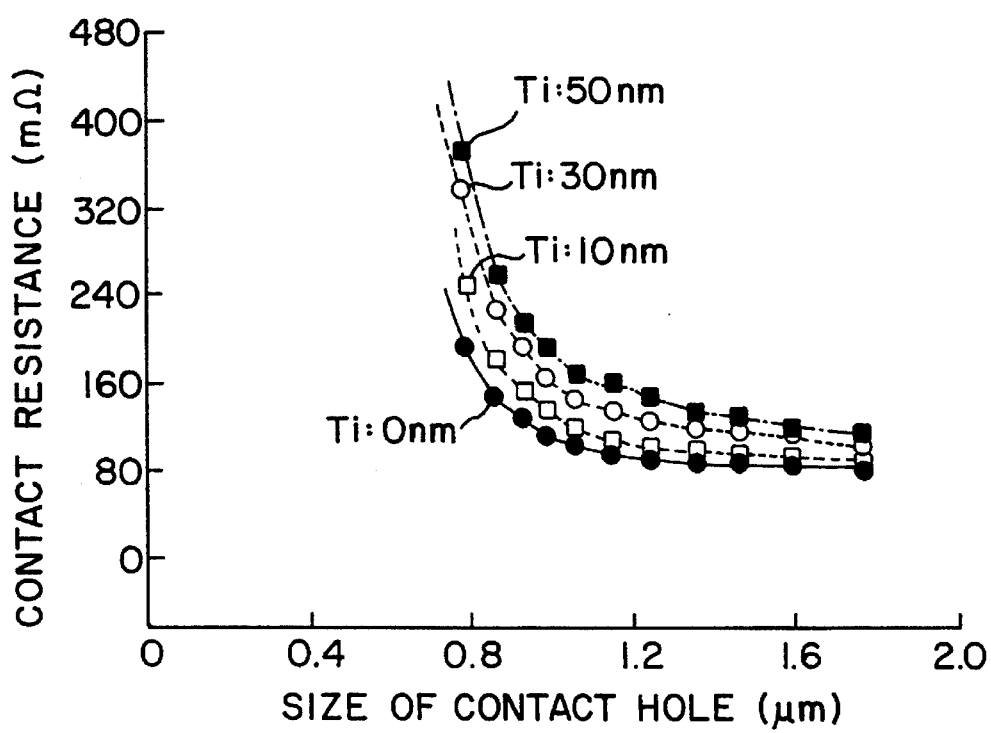
FIG. 4 is a diagram showing the relation between the contact resistance value and the size of a connection hole in accordance with the present invention.

FIG. 4 shows the relation between the contact hole size and contact resistance.

This study uses the same samples which were used in FIG. 3. However, the titanium film was used in the refractory metal film in the bottom layer which is the second conductive film layer, and the thickness of the titanium film was 10 nm, 30 nm, and 50 nm, and the resistance of the contact chain was measured.

The contact resistance was expressed by the value of resistance per one second connection hole by dividing the total resistance value of the contact chain by 10,000 (or the number of contacts).

The contact chain resistance is compared between the prior art and this embodiment. In this embodiment, the thickness of the titanium film as the second conductive film layer is 50 nm. In the prior art, without titanium film, the aluminum alloy film in a thickness of 1000 nm was used as the second conductive film layer. The contact resistance of this embodiment at this time was about 30 to 40% higher than that of the prior art.

The resistance of the contact chain approaches the resistance of the conventional constitution when the thickness of the titanium film becomes smaller than 50 nm. When the thickness of the titanium film is greater than 50 nm, the contact resistance further increases. On the other hand, to suppress the formation of voids in the second connection holes, it is more advantageous when the thickness of the titanium film is greater.

Figure 5:
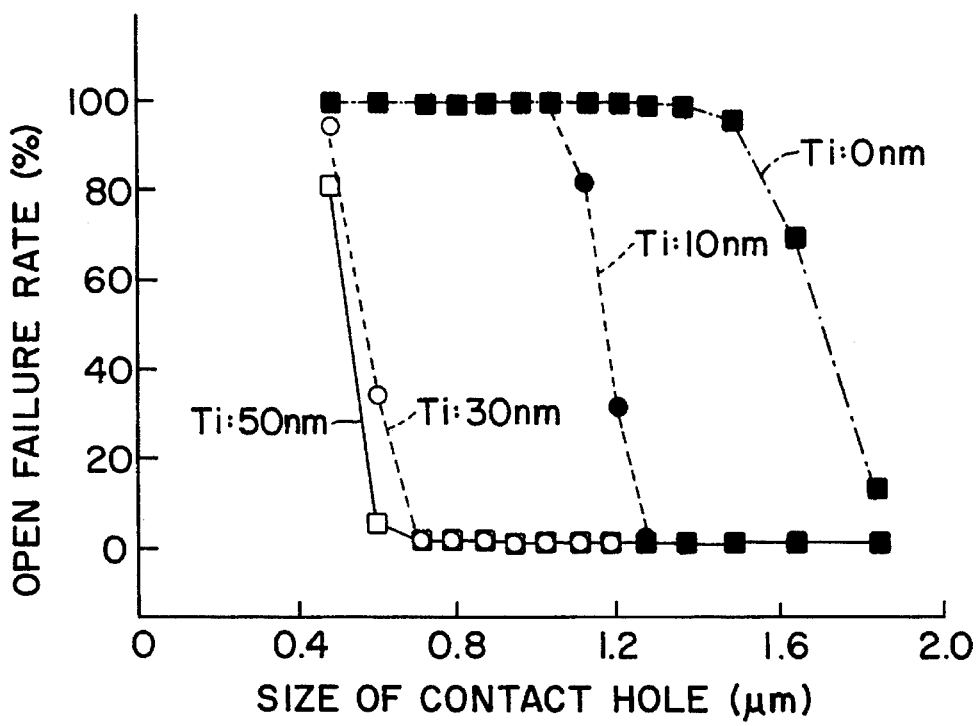
FIG. 5 is a diagram showing the dependence of open failure rate on titanium film thickness in accordance with the present invention.

FIG. 5 shows the relation between the contact hole size and the open failure rate at the titanium film in 10 nm, 30 nm, and 50 nm thicknesses. The contact hole indicates the diameter of the second connection holes. In this study, all samples were carried out at high temperature storage for 1000 hours at 180° C. in a nitrogen atmosphere. The diagram also shows the result of the prior art without titanium film.

When the thickness of titanium film is 30 nm, the diameter of the second connection holes at which the open failure rate begins to increase is greater than that when the thickness of titanium film is 50 nm. That is, when the thickness of titanium film is 30 nm, the open failure rate begins to increase at the diameter of the second connection holes of about 0.7 μm, while in the case of titanium film in 50 nm thickness, it is about 0.6 μm. Similarly, a more obvious difference is noted at the titanium film in 10 nm thickness.

Therefore, in the state of maintaining the reliability of finer second connection holes, if an attempt is made to suppress the increase of wiring resistance, it is necessary to select the titanium film having a proper thickness depending on the semiconductor device. For example, when manufacturing a semiconductor device for which the diameter of second connection holes is 1.0 μm, for an aluminum alloy film in a thickness of 700 to 1200 nm, a titanium film in 50 nm thickness should be used as the second conductive film layer.

Figure 6:
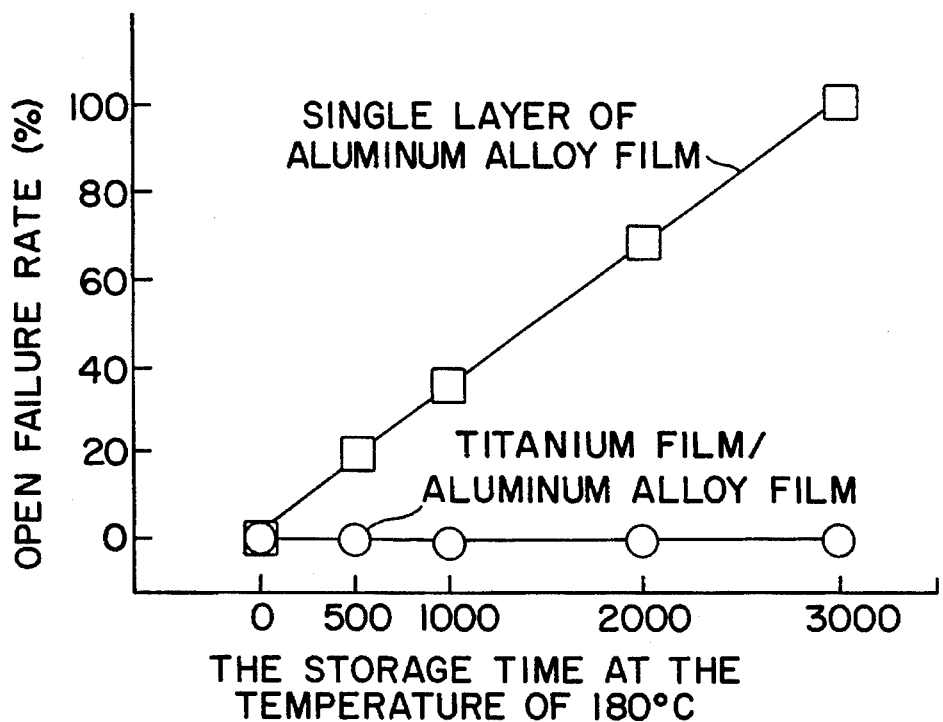
FIG. 6 is a diagram showing the relation between the storage time at 180° C. and open failure rate in accordance with the present invention.

FIG. 6 shows the relation between the open failure rate and the time of leaving the semiconductor device in nitrogen atmosphere at the temperature of 180° C. The result suggests that the open failure rate for disconnection varies due to occurrence of voids inside the second conductive film layer.

This change of open failure rate means the transitional change of the open failure rate when leaving the semiconductor device at the temperature of 180° C.

The diagram discloses a case using a single layer of aluminum alloy film in the prior art and a case of the aluminum alloy film deposited titanium film as the bottom layer in this embodiment.

In the sample of the invention, the second conductive film layer is composed of titanium film in 50 nm thickness and aluminum alloy film in 1000 nm thickness. The second conductive film layer is 0.8 μm in wire width and 60 cm in wiring length. A total of 267 pieces of such a pattern were fabricated on the 6-inch P-type semiconductor substrate, and the electric conductive state was investigated, and the open failure rate was calculated. In addition, for the ease of forming voids on the aluminum alloy film as the second conductive film layer of the semiconductor device, a silicon nitride film with a high stress is usually formed as passivation film directly on the second conductive film layer. The silicon nitride film is formed in 800 nm thickness by the method of plasma enhanced chemical vapor deposition.

As shown in FIG. 6, in the single layer of aluminum alloy film, as the storage time at the temperature of 180° C. becomes longer, the open failure rate of the semiconductor device increases. This means that the voids formed in the aluminum alloy film grow as the storage time passes. By growth of voids, the wire breakdown is likely to occur, and the open failure rate increases. By contrast, by depositing titanium film which is a refractory metal in the bottom layer of the second conductive film layer, it is known that voids are not formed in the aluminum alloy film of the top of the second conductive film layer. Even after letting the semiconductor device stand for 3000 hours, the second conductive film layer is not broken, and the open failure rate does not elevate. Thus, by depositing the titanium film in the bottom layer, the reliability of second connection holes is improved, and the resistance of the second conductive film layer which is the aluminum alloy film to stress migration is enhanced at the same time.

Furthermore, since titanium film is a very reactive metal, alloying is also promoted on the first conductive film layer formed on the bottom of the second connection holes. As a result, the contact failures are decreased notably when connecting the first conductive film layer and second conductive film layer through the second connection holes. Thus, the refractory metal film is capable of preventing formation of voids in the aluminum alloy film, and by titanium film as the refractory metal film, furthermore, contact failures in the second connection holes may be reduced.

The titanium film is a highly reactive material, and the same effects are obtained by an alloy film of titanium and other refractory metal, for example, an alloy film of titanium and tungsten.

As, therefore, titanium film is reactive for the chemical characteristics, the titanium and the first conductive film layer 27 at the bottom of the second connect hole 25 are promoted to alloy. Thus, contact failure of first conductive film layer 23 and second conductive film layer 27 are decreased remarkably.

Figure 7:
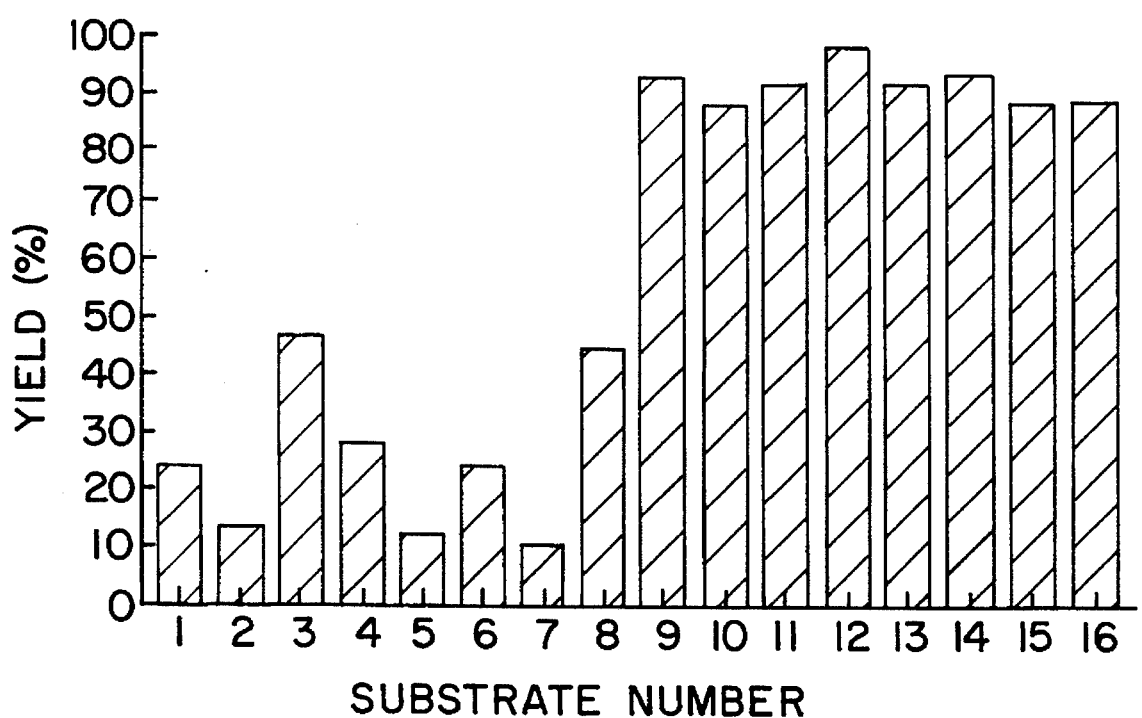
FIG. 7 is a diagram showing the yield for a semiconductor device fabricated in accordance with the present invention as compared with the prior art.
Figure 8A:
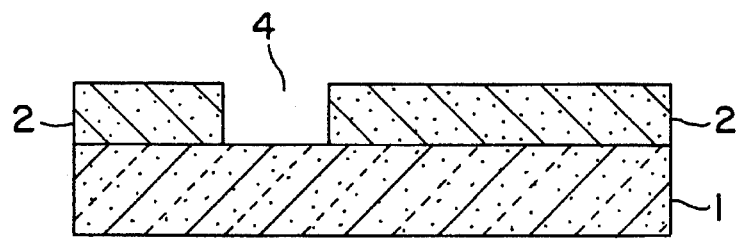
FIGS. 8a through 8d are process sectional views.
Figure 8B:
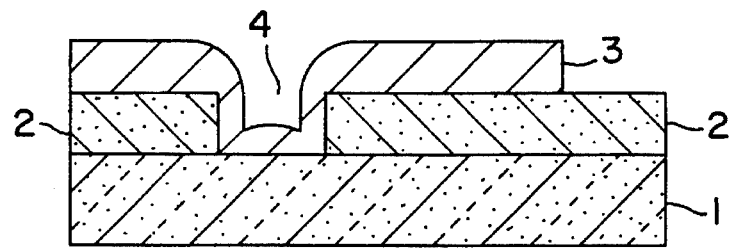
Figure 8C:
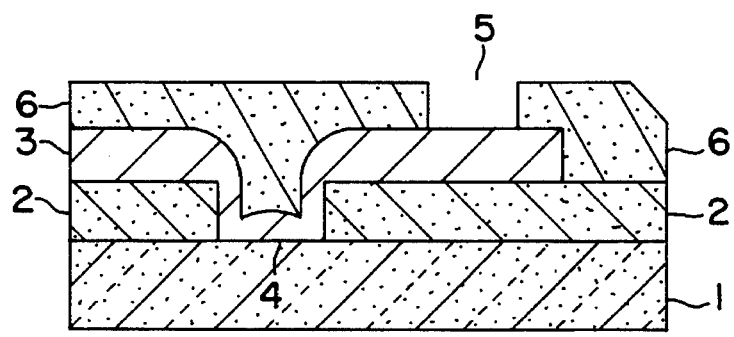
Figure 8D:
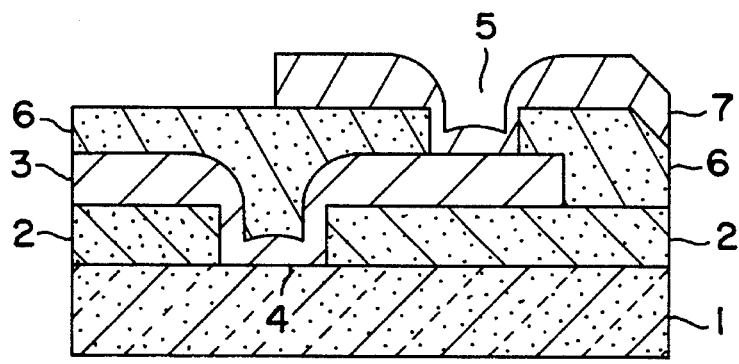
Figure 9:
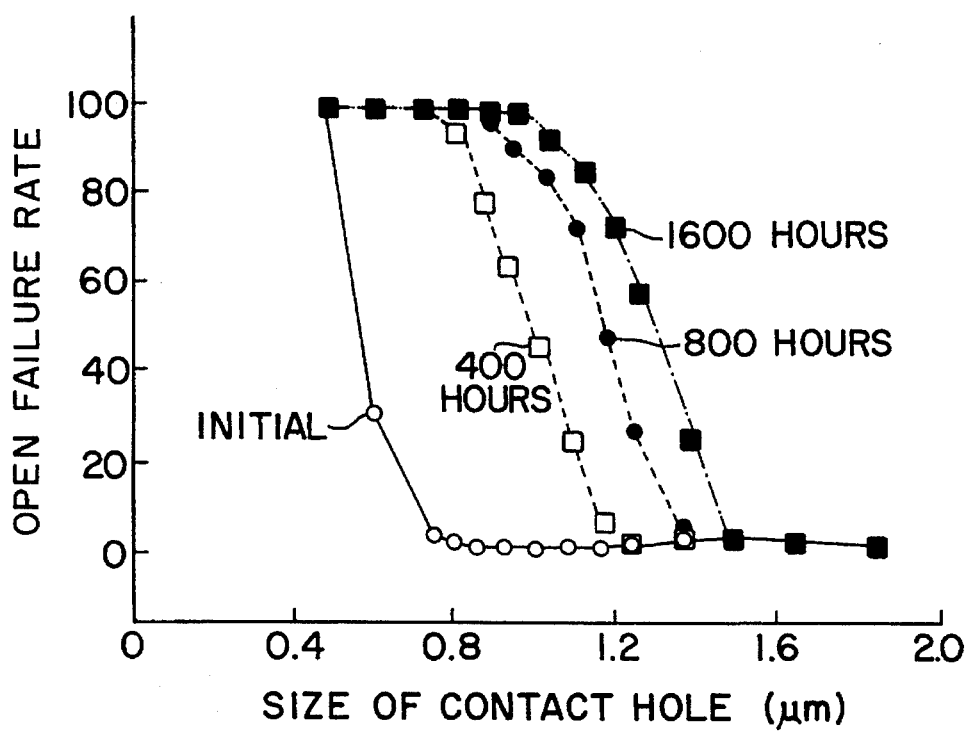
FIG. 9 is a diagram showing the relation between the size of connection holes and open failure rates in accordance with the prior art.
Figure 10:
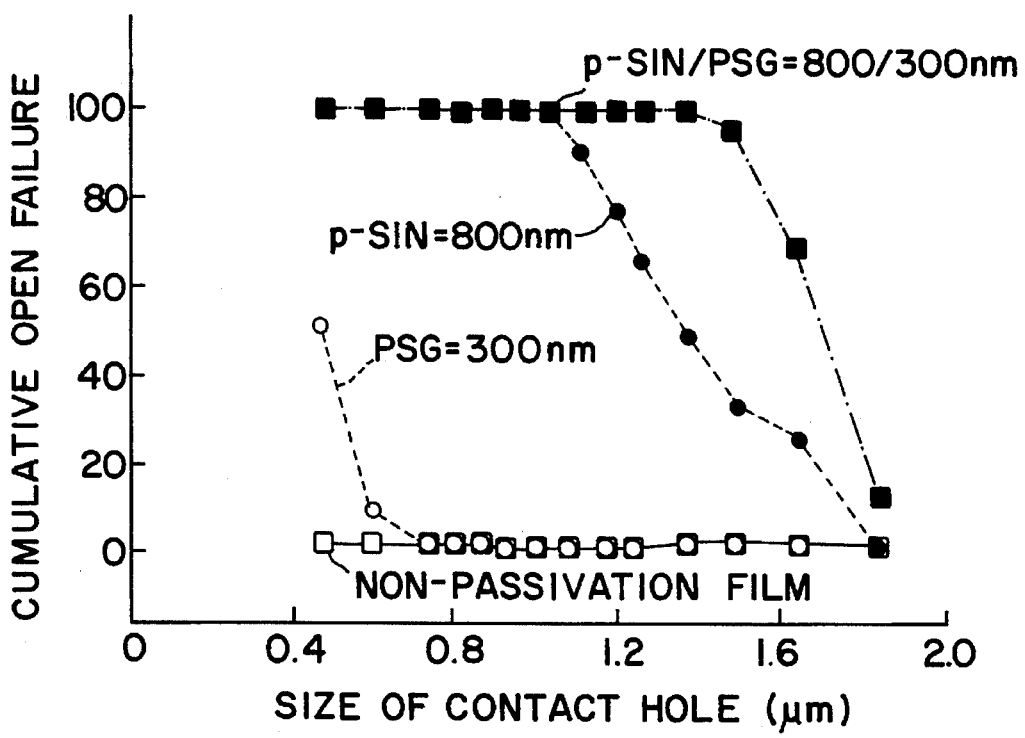
FIG. 10 is a diagram showing the dependence of cumulative open failure rate on the stress of passivation film in accordance with the prior art.

FIG. 7 is a diagram showing the yield of a semiconductor device fabricated in accordance with the present invention as compared with the prior art. Semiconductor devices with 900,000 second connection holes in a chip of 30 mm² area are fabricated on a 6 inch semiconductor substrate. FIG. 7 is a diagram showing the yield for substrates of various numbers. Yields of semiconductor devices fabricated with the prior art are shown relative to substrate numbers 1 to 8. The substrates numbered 9 to 16 are yields of semiconductor deviced fabricated according to the present invention. The yield is higher for semiconductor devices formed in accordance with the present invention than for semiconductor devices formed in accordance with the prior art. This suggests that the reliability of semiconductor devices which are fabricated in accordance with the present invention are superior to that of the prior art. That is, titanium film of refractory metal film beneath the second conductive film layer may prevent occurrence of voids in aluminum alloy film and result in a decrease in the contact failure rate in second connection holes.

Thus, by composing the second conductive film layer of two layers of refractory metal and aluminum alloy film, formation of voids in the aluminum alloy film may be suppressed. As a result, the reliability of the finer second connection holes (as compared with the prior art) may be maintained. In addition, the wiring density of semiconductor devices may be greatly raised. That is, in an area smaller than in the prior art, a semiconductor device with equivalent functions may be fabricated. Furthermore, without increasing the chip size, a semiconductor device having higher functions may be fabricated. By using titanium film or alloy film of titanium and tungsten as the refractory metal, moreover, it is possible to more tightly connect with the first conductive film than in the prior art. Hence, the semiconductor devices may be manufactured at a higher successful rate than in the prior art.

What is claimed is:

1. A semiconductor device comprising:

a first interlayer dielectric film layer possessing first connection holes at specified positions on a semiconductor substrate, a first refractory metal film formed in a specified region including said first connection holes, said first refractory metal film contacting said semiconductor substrate at the bottom of said first connection holes, a nitride film of said first refractory metal formed on said first refractory metal film, a second refractory metal film different in composition than said nitride film formed on said nitride film, a first aluminum alloy film formed on said second refractory metal film, an anti-reflection film possessing second connection holes at specified positions formed on said first aluminum alloy film, a second interlayer dielectric film layer possessing said second connection holes formed on said anti-reflection film, a third refractory metal film comprised of a single layer and formed in a specified region including said second connection holes, said third refractory metal film contacting said first aluminum alloy film at the bottom of said second connection holes, and a second aluminum alloy film formed on said third refractory metal film, wherein said second interlayer dielectric film layer is comprised of an intermediate layer of spun-on inorganic or organic silica in gel form.

2. A semiconductor device comprising:

a first interlayer dielectric film layer possessing first connection holes at specified positions on a semiconductor substrate, a first refractory metal film formed in a specified region including said first connection holes, said first refractory metal film contacting said semiconductor substrate at the bottom of said first connection holes, a nitride film of said first refractory metal formed on said first refractory metal film, a first aluminum alloy film formed on said nitride film, an anti-reflection film possessing second connection holes at specified positions formed on said first aluminum alloy film, a second interlayer dielectric film layer possessing said second connection holes formed on said anti-reflection film, a second refractory metal film comprised of a single layer and formed in a specified region including said second connection holes, said second refractory metal film contacting said first aluminum alloy film at the bottom of said second connection holes, and a second aluminum alloy film formed on said second refractory metal film, wherein thickness of said second refractory metal film is 30 to 150 nm.

3. A semiconductor device comprising:

a first interlayer dielectric film layer possessing first connection holes at specified positions on a semiconductor substrate, a first refractory metal film formed in a specified region including said first connection holes, said first refractory metal film contacting said semiconductor substrate at the bottom of said first connection holes, a nitride film of said first refractory metal formed on said first refractory metal film, a second refractory metal film formed on said nitride film, a first aluminum alloy film formed on said second refractory metal film, an anti-reflection film possessing second connection holes at specified positions formed on said first aluminum alloy film, a second interlayer dielectric film layer possessing said second connection holes formed on said anti-reflection film, a third refractory metal film comprised of a single layer and formed in a specified region including said second connection holes, said third refractory metal film contacting said first aluminum alloy film at the bottom of said second connection holes, and a second aluminum alloy film formed on said third refractory metal film, wherein thickness of said third refractory metal film is 30 to 150 nm.

* * * * *

UNITED STATES PATENT AND TRADE MARK OFFICE
CERTIFICATE OF CORRECTION

PATENT NO.   : 5,459,353
DATED        : October 17, 1995
INVENTOR(S)  : Kanazawa It is certified that error appears in the above-identified patent and that said Letters Patent is hereby corrected as shown below:

Column 14, line 55, change "400 rim" to --400 nm--.

Signed and Sealed this

Twenty-eighth Day of May, 1996

Attest:

BRUCE LEHMAN

*Attesting Officer*    *Commissioner of Patents and Trademarks*